United States Patent
Adachi et al.

(10) Patent No.: US 8,174,264 B2
(45) Date of Patent: May 8, 2012

(54) MAGNETIC RESONANCE DIAGNOSTIC APPARATUS, MAGNETIC RESONANCE DIAGNOSTIC MAIN UNIT AND COIL UNIT

(75) Inventors: Kohei Adachi, Nasushiobara (JP); Kazuya Okamoto, Saitama (JP)

(73) Assignees: Kabushiki Kaisha Toshiba, Tokyo (JP); Toshiba Medical Systems Corporation, Tochigi-Ken (JP)

( * ) Notice: Subject to any disclaimer, the term of this patent is extended or adjusted under 35 U.S.C. 154(b) by 180 days.

(21) Appl. No.: 12/492,960

(22) Filed: Jun. 26, 2009

(65) Prior Publication Data

US 2009/0322335 A1     Dec. 31, 2009

(30) Foreign Application Priority Data

Jun. 30, 2008  (JP) ................. 2008-171409
May 20, 2009  (JP) ................. 2009-122247

(51) Int. Cl.
     *G01V 3/00*     (2006.01)
(52) U.S. Cl. ................... 324/318; 324/322
(58) Field of Classification Search ............... 324/318, 324/322, 300, 309, 307
     See application file for complete search history.

(56) References Cited

U.S. PATENT DOCUMENTS

| | | | |
|---|---|---|---|
| 5,384,536 A | 1/1995 | Murakami et al. | |
| 7,123,009 B1 * | 10/2006 | Scott | 324/311 |
| 7,323,876 B2 * | 1/2008 | Den Boef | 324/322 |
| 7,443,165 B2 * | 10/2008 | Varjo | 324/322 |
| 7,750,635 B2 * | 7/2010 | Van Helvoort et al. | 324/318 |

FOREIGN PATENT DOCUMENTS

| JP | 2006-297067 A | 11/2006 |
|---|---|---|
| JP | 2008-518652 A | 6/2008 |

* cited by examiner

*Primary Examiner* — Louis Arana
(74) *Attorney, Agent, or Firm* — Knoble Yoshida & Dunleavy, LLC

(57) ABSTRACT

An magnetic resonance diagnostic apparatus which includes a main unit and a coil unit, the magnetic resonance diagnostic apparatus including a sampling clock generating unit which generates a sampling clock signal, a sampling clock transmitting unit wirelessly transmits the sampling clock signal, a sampling clock receiving unit which receives the transmitted sampling clock signal, a receiving coil which outputs an electrical magnetic resonance signal in response to a magnetic resonance signal emitted from a subject as electromagnetic radiation, a digitization unit which digitizes, synchronously with the received sampling clock signal, the outputted magnetic resonance signal, a resonance signal transmitting unit which wirelessly transmits the digitized magnetic resonance signal, a resonance signal receiving unit which receives the transmitted magnetic resonance signal, and a reconstruction unit which processes, synchronously with the generated sampling clock signal, the received magnetic resonance signal and thereby reconstructs an image of the subject.

6 Claims, 5 Drawing Sheets

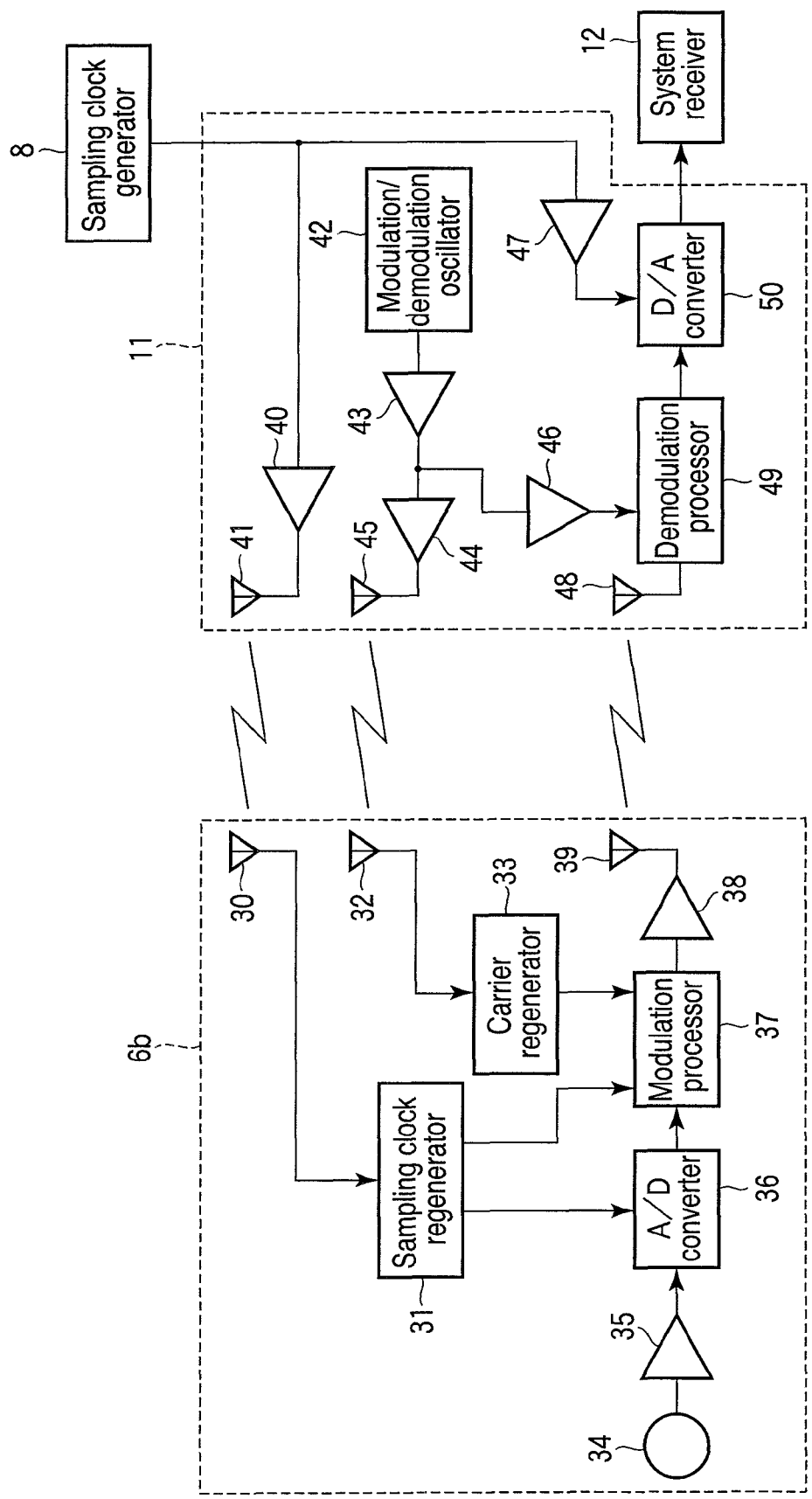
F I G. 2

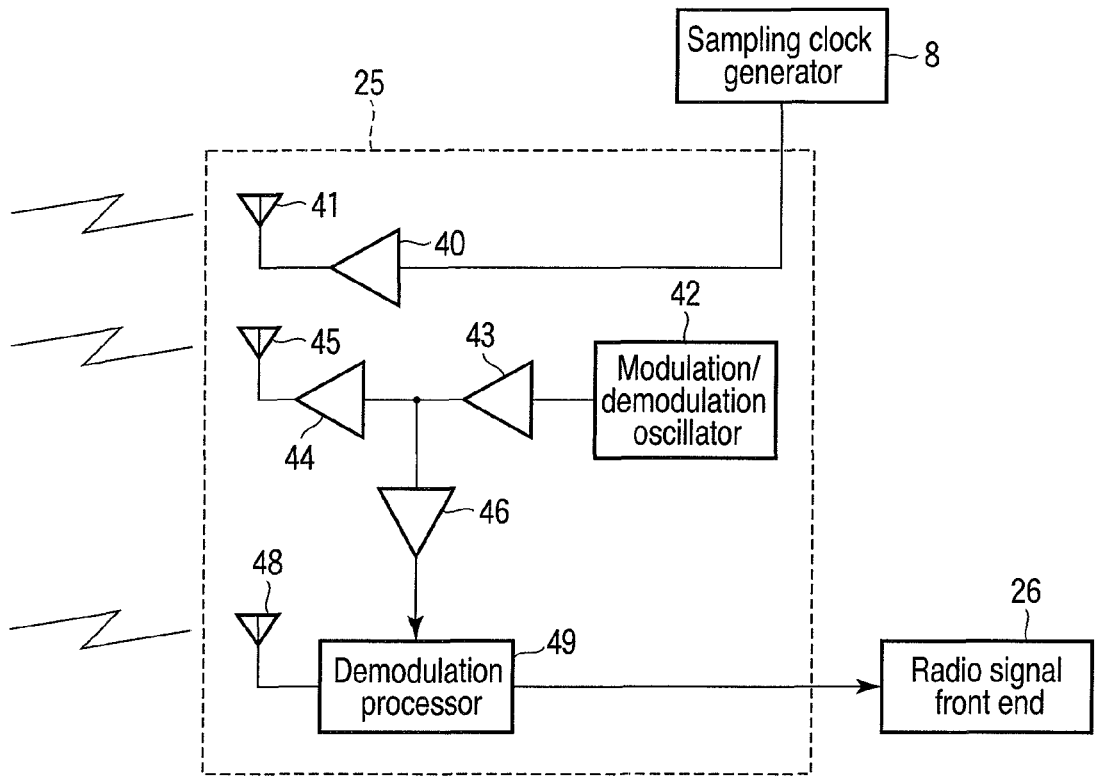
F I G. 4
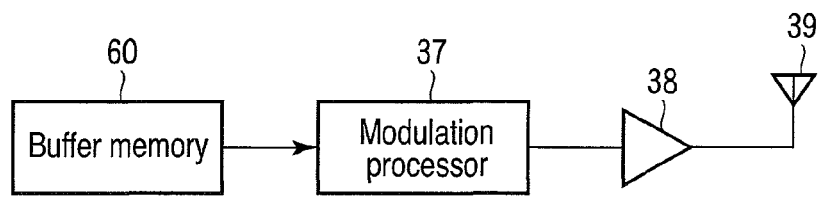
F I G. 6

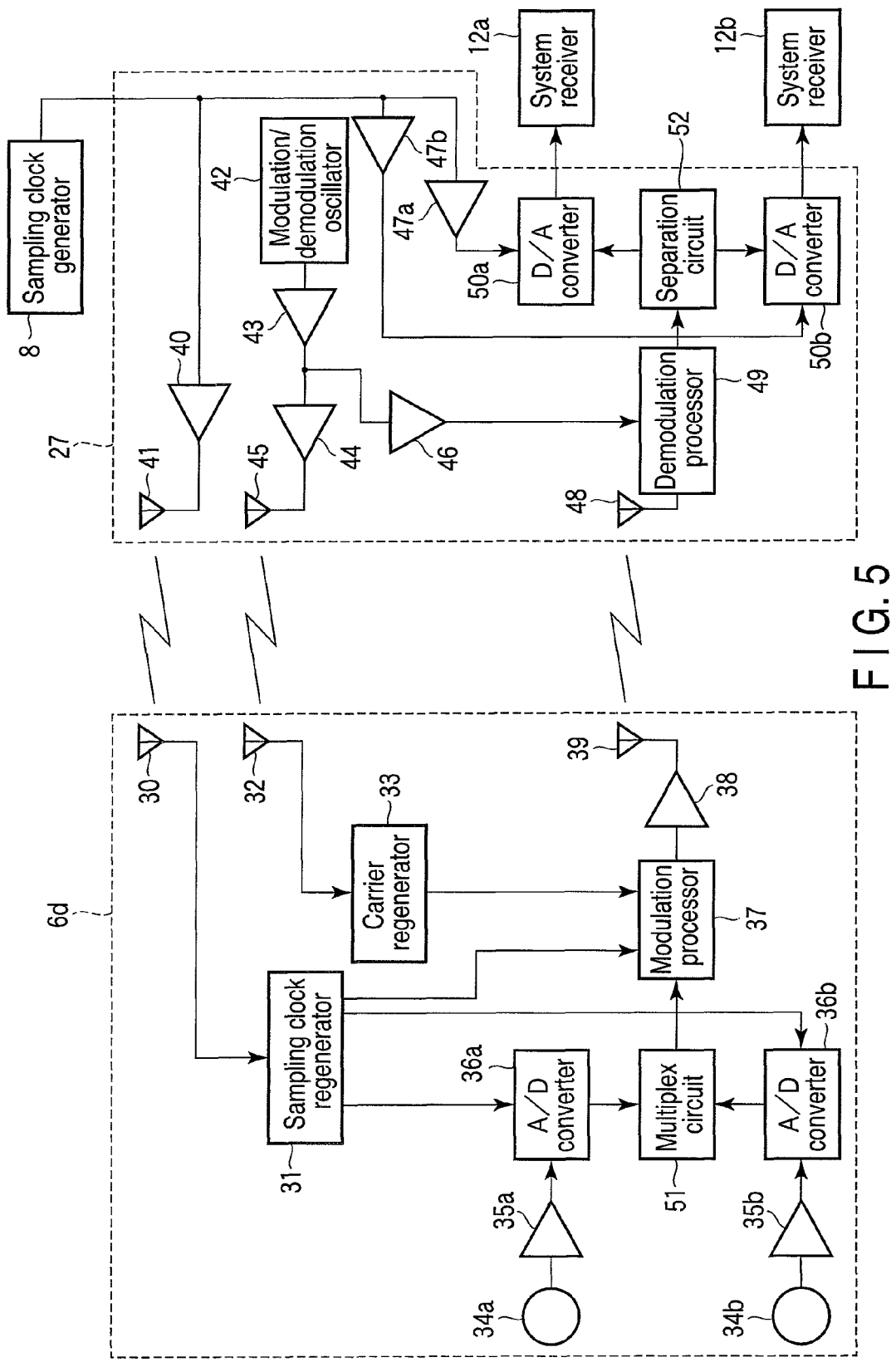
F I G. 5

MAGNETIC RESONANCE DIAGNOSTIC APPARATUS, MAGNETIC RESONANCE DIAGNOSTIC MAIN UNIT AND COIL UNIT

CROSS-REFERENCE TO RELATED APPLICATIONS

This application is based upon and claims the benefit of priority from prior Japanese Patent Applications No. 2008-171409, filed Jun. 30, 2008; and No. 2009-122247, filed May 20, 2009, the entire contents of both of which are incorporated herein by reference.

BACKGROUND OF THE INVENTION

1. Field of the Invention

The present invention relates to a magnetic resonance diagnostic apparatus for obtaining an image to diagnose a subject on the basis of an electrical magnetic resonance signal which is output by a receiving coil in response to a magnetic resonance signal emitted from the subject as electromagnetic radiation. The present invention also relates to a magnetic resonance diagnostic unit and a coil unit to constitute the magnetic resonance diagnostic apparatus.

2. Description of the Related Art

Generally, in a magnetic resonance diagnostic apparatus, a collection system is becoming increasingly multichannel, so that a large number of coil units can be connected to a main unit. As a result, the number of connecting cables between the coil units and the main unit is inconveniently increased, and it is therefore desired that signal transmission between the coil units and the main unit be wireless.

Under such circumstances, there has already been proposed a technique to obtain wireless signal transmission between the coil units and the main unit (e.g., refer to Jpn. Pat. Appln. KOKAI Publication No. 2006-297067).

However, all of the techniques that have already been proposed are based on analog radio systems. Analog radio systems have various limitations including the decrease of a dynamic range due to a signal loss attributed to space propagation, and have not been put into practical use. In the magnetic resonance diagnostic apparatus in particular, in order to suppress the effect on reception performance for weak magnetic resonance signals emitted from a subject, radio output for the signal transmission between the coil units and the main unit can not be increased. Therefore, the decrease of the dynamic range has a great effect on the transmission quality of the magnetic resonance signals.

BRIEF SUMMARY OF THE INVENTION

Under these circumstances, it has been desired to constrain radio output to suppress the effect of a magnetic resonance signal on reception performance, and at the same time, to enable satisfactory wireless transmission of the magnetic resonance signal between coil units and a main unit.

According to a first aspect of the present invention, there is provided a magnetic resonance diagnostic apparatus which includes a main unit and a coil unit separate from the main unit, the magnetic resonance diagnostic apparatus comprising: a sampling clock generating unit which is provided in the main unit and which generates a sampling clock signal; a sampling clock transmitting unit which is provided in the main unit and which wirelessly transmits the sampling clock signal generated by the sampling clock generating unit; a sampling clock receiving unit which is provided in the coil unit and which receives the sampling clock signal transmitted by the sampling clock transmitting unit; a receiving coil which is provided in the coil unit and which outputs an electrical magnetic resonance signal in response to a magnetic resonance signal emitted from a subject as electromagnetic radiation; a digitization unit which is provided in the coil unit and which digitizes, synchronously with the sampling clock signal received by the sampling clock receiving unit, the magnetic resonance signal output by the receiving coil; a resonance signal transmitting unit which is provided in the coil unit and which wirelessly transmits the magnetic resonance signal digitized by the digitization unit; a resonance signal receiving unit which is provided in the main unit and which receives the magnetic resonance signal transmitted by the resonance signal transmitting unit; and a reconstruction unit which is provided in the main unit and which processes, synchronously with the sampling clock signal generated by the sampling clock generating unit, the magnetic resonance signal received by the resonance signal receiving unit and thereby reconstructs an image of the subject.

According to a second aspect of the present invention, there is provided a magnetic resonance diagnostic main unit which configures a magnetic resonance diagnostic apparatus together with a coil unit, the coil unit including: a sampling clock receiving unit which receives a wirelessly transmitted sampling clock signal; a receiving coil which outputs an electrical magnetic resonance signal in response to a magnetic resonance signal emitted from a subject as electromagnetic radiation; a digitization unit which digitizes, synchronously with the sampling clock signal received by the sampling clock receiving unit, the magnetic resonance signal output by the receiving coil; and the reconstruction unit subjects the magnetic resonance signal received by the resonance signal receiving unit to digital processing to uncompress the amplitude of the magnetic resonance signal compressed by the compression unit, and then reconstructs an image of the subject on the basis of the magnetic resonance signal which has been subjected to the digital processing.

According to a third aspect of the present invention, there is provided a magnetic resonance diagnostic main unit which configures a magnetic resonance diagnostic apparatus together with a coil unit, the coil unit including: a sampling clock receiving unit which receives a wirelessly transmitted sampling clock signal; a receiving coil which outputs an electrical magnetic resonance signal in response to a magnetic resonance signal emitted from a subject as electromagnetic radiation; a digitization unit which digitizes, synchronously with the sampling clock signal received by the sampling clock receiving unit, the magnetic resonance signal output by the receiving coil; and a resonance signal transmitting unit which wirelessly transmits the magnetic resonance signal digitized by the digitization unit, the magnetic resonance diagnostic main unit comprising: a sampling clock generating unit which generates the sampling clock signal; a sampling clock transmitting unit which wirelessly transmits the sampling clock signal generated by the sampling clock generating unit; a resonance signal receiving unit which receives the magnetic resonance signal transmitted by the resonance signal transmitting unit; and a reconstruction unit which processes, synchronously with the sampling clock signal generated by the sampling clock generating unit, the magnetic resonance signal received by the resonance signal receiving unit and thereby reconstructs an image of the subject.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 2 is a block diagram showing the specific configurations of an RF coil unit and a radio unit in FIG. 1;

FIG. 4 is a block diagram showing the specific configuration of a radio unit in FIG. 3;

FIG. 5 is a block diagram showing the configurations of an RF coil unit and a radio unit according to a modification of the present invention; and FIG. 6 is a block diagram showing the configuration of an RF coil unit according to a modification of the present invention.

DETAILED DESCRIPTION OF THE INVENTION

Embodiments of the present invention will be described hereinafter with reference to the drawings.

First Embodiment

Figure 1:
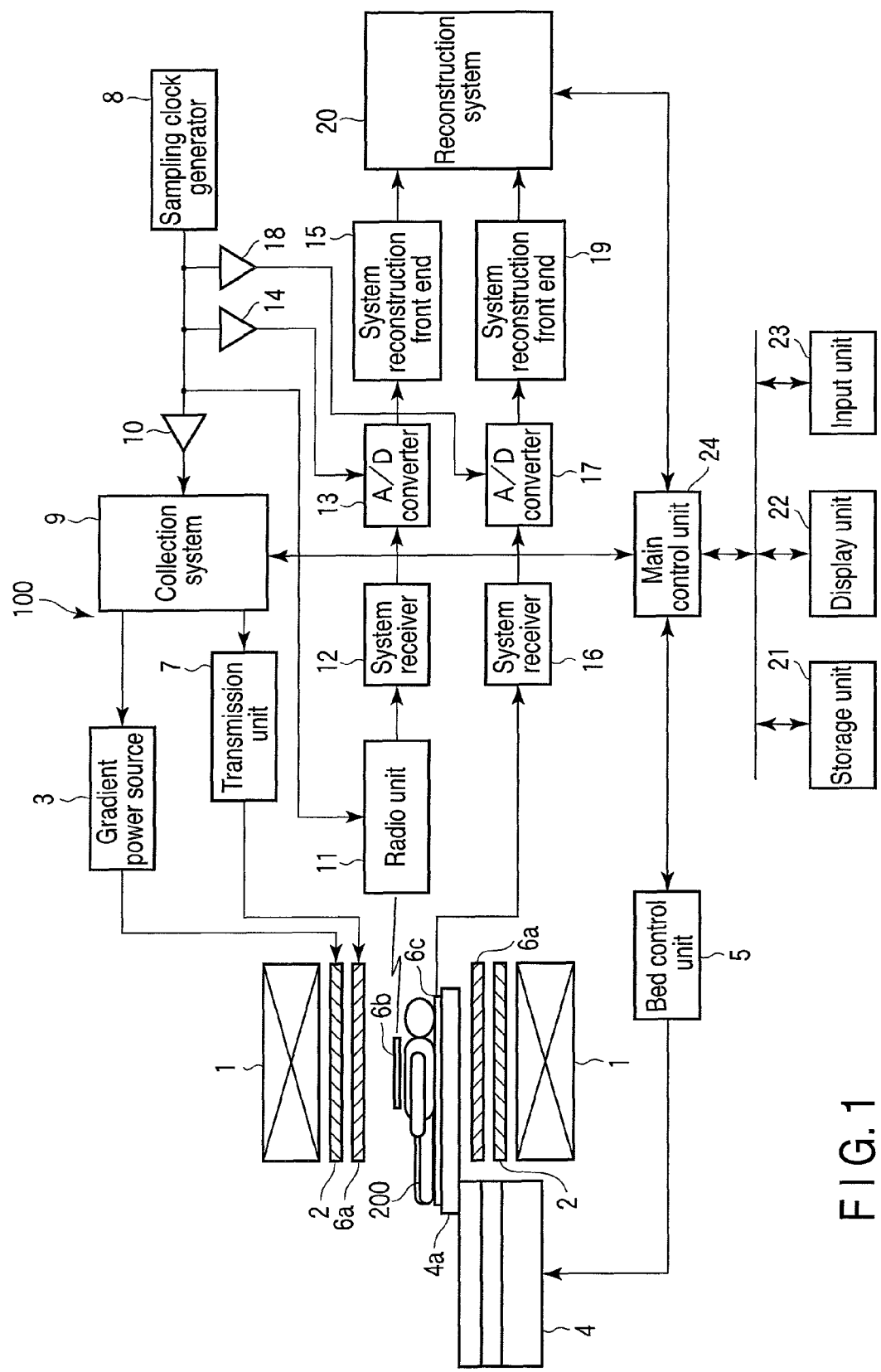
FIG. 1 is a diagram showing the configuration of a magnetic resonance diagnostic apparatus according to a first embodiment of the present invention.

FIG. 1 is a diagram showing the configuration of a magnetic resonance diagnostic apparatus 100 according to a first embodiment of the present invention. The magnetic resonance diagnostic apparatus 100 comprises a static field magnet 1, a gradient magnetic field coil 2, a gradient power source 3, a bed 4, a bed control unit 5, RF coil units 6a, 6b, 6c, a transmission unit 7, a sampling clock generator 8, a collection system 9, a driver 10, a radio unit 11, a system receiver 12, an analog-to-digital converter (A/D converter) 13, a driver 14, a system reconstruction front end 15, a system receiver 16, an analog-to-digital converter (A/D converter) 17, a driver 18, a system reconstruction front end 19, a reconstruction system 20, a storage unit 21, a display unit 22, an input unit 23, and a main control unit 24. Among these components, the components other than RF coil units 6b, 6c are included in a main unit separate from RF coil units 6b, 6c. Moreover, the main unit may be divided into a gantry and a processing unit. In this case, for example, the static field magnet 1, the gradient magnetic field coil 2, the gradient power source 3, the bed 4, the bed control unit 5, RF coil unit 6a, the transmission unit 7, the collection system 9, radio unit 11, the system receiver 12, analog-to-digital converter 13, the system receiver 16 and analog-to-digital converter 17 are included in the gantry, while the sampling clock generator 8, driver 10, driver 14, the system reconstruction front end 15, driver 18, the system reconstruction front end 19, the reconstruction system 20, the storage unit 21, the display unit 22, the input unit 23 and the main control unit 24 are included in the processing unit.

The static field magnet 1 has a hollow cylindrical shape, and generates a uniform static magnetic field in its internal space. For example, a permanent magnet or superconducting magnet is used as the static field magnet 1.

The gradient magnetic field coil 2 has a hollow cylindrical shape, and is disposed inside the static field magnet 1. The gradient magnetic field coil 2 has a combination of three kinds of coils corresponding to X, Y, Z axes perpendicular to each other. The gradient magnetic field coil 2 generates a gradient magnetic field having its intensity inclined along the X, Y, Z axes when the three kinds of coils are separately supplied with currents from the gradient power source 3. In addition, the Z axis is in the same direction as, for example, the direction of the static magnetic field. The gradient magnetic fields of the X, Y, Z axes correspond to, for example, a slice selecting gradient magnetic field Gs, a phase encoding gradient magnetic field Ge and a read-out gradient magnetic field Gr, respectively. The slice selecting gradient magnetic field Gs is used to determine a given photographic section. The phase encoding gradient magnetic field Ge is used to change the phase of a magnetic resonance signal in accordance with a spatial position. The read-out gradient magnetic field Gr is used to change the frequency of the magnetic resonance signal in accordance with the spatial position.

A subject 200 is inserted into an internal space (imaging space) of the gradient magnetic field coil 2 while being mounted on a top board 4a of the bed 4. The bed 4 moves the top board 4a in its longitudinal direction (right-and-left direction in FIG. 1) and its vertical direction under the control of the bed control unit 5. Normally, the bed 4 is installed so that this longitudinal direction is parallel with the central axis of the static field magnet 1.

RF coil unit 6a includes one coil or a plurality of coils contained in a cylindrical case. RF coil unit 6a is disposed inside the gradient magnetic field coil 2. RF coil unit 6a is supplied with a high-frequency pulse (RF pulse) from the transmission unit 7 to generate a high-frequency magnetic field.

RF coil units 6b, 6c are mounted on the top board 4a, embedded in the top board 4a, or attached to the subject 200. At the time of photography, RF coil units 6b, 6c are inserted into the imaging space together with the subject 200, and receive the magnetic resonance signal emitted from the subject 200 as electromagnetic radiation to obtain an electrical magnetic resonance signal. Various types of RF coil units can be attached as RF coil units 6b, 6c. Moreover, one receiving RF coil unit or three or more receiving RF coil units may be attached. RF coil unit 6b has a function of digitally and wirelessly transmitting the magnetic resonance signal obtained as an electrical signal.

The transmission unit 7 supplies RF coil unit 6a with RF pulse corresponding to a Larmor frequency.

The sampling clock generator 8 generates a sampling clock signal having a predetermined frequency. This sampling clock signal may be used as a system clock serving as a reference for the timing of the overall operation of the magnetic resonance diagnostic apparatus 100.

The collection system 9 controls the gradient power source 3 and the transmission unit 7 so that changes the gradient magnetic fields in accordance with a required pulse sequence under the control of the main control unit 24. The collection system 9 controls the gradient power source 3 and the transmission unit 7 so that RF pulse may be transmitted in accordance with the required pulse sequence under the control of the main control unit 24. In addition, the collection system 9 is provided with the sampling clock signal after the level of this signal has been properly adjusted by driver 10. The collection system 9 carries out the pulse sequence synchronously with this sampling clock signal.

Radio unit 11 receives the magnetic resonance signal digitally and wirelessly transmitted from RF coil unit 6b. Radio unit 11 converts the received digital magnetic resonance signal into an analog form, and then outputs the analog signal to the system receiver 12. Radio unit 11 also wirelessly transmits the sampling clock signal and a modulation/demodulation clock signal to RF coil unit 6b.

FIG. 2 is a block diagram showing the specific configurations of RF coil unit 6b and radio unit 11 in FIG. 1.

RF coil unit 6b includes an antenna 30, a sampling clock regenerator 31, an antenna 32, a carrier regenerator 33, an RF coil 34, a logarithmic amplifier 35, an analog-to-digital converter (A/D converter) 36, a modulation processor 37, a driver 38, and an antenna 39. Further, radio unit 11 includes a driver 40, an antenna 41, a modulation/demodulation oscillator 42, drivers 43, 44, an antenna 45, drivers 46, 47, an antenna 48, a demodulation processor 49, and a digital-to-analog converter (D/A converter) 50.

Driver 40 adjusts the level of the sampling clock signal output from the sampling clock generator 8 to a level suitable for wireless transmission.

When supplied with the sampling clock signal output from driver 40, antenna 41 emits this signal as electromagnetic radiation into space.

In response to electromagnetic radiation including the electromagnetic radiation emitted from antenna 41, antenna 30 outputs a corresponding electrical signal.

The sampling clock regenerator 31 extracts a signal of a component corresponding to the sampling clock signal from the electrical signal output by antenna 30, and regenerates a sampling clock signal on the basis of the extracted signal. For example, a voltage controlled oscillator (VCO) or a phase locked loop (PLL) is used to regenerate the sampling clock signal. The sampling clock regenerator 31 may superposes an analog-to-digital conversion start signal on the regenerated sampling clock signal. Subsequently, the sampling clock regenerator 31 adjusts the level of the sampling clock signal on which the analog-to-digital conversion start signal has been superposed to an appropriate level, and then supplies the signal to analog-to-digital converter 36 and the modulation processor 37. In addition, binary phase shift keying (BPSK), for example, can be used for the superposition of the analog-to-digital conversion start signal.

The modulation/demodulation oscillator 42 generates a carrier having a predetermined frequency. The frequency of the carrier is set to such a value that avoids a frequency equal to a fraction of the integer of a magnetic resonant frequency.

Driver 43 adjusts the level of the carrier output by the modulation/demodulation oscillator 42 to a predetermined level.

Driver 44 adjusts the level of the carrier output by driver 43 to a level suitable for wireless transmission.

When supplied with the carrier output from driver 44, antenna 45 emits the carrier as electromagnetic radiation into space.

In response to electromagnetic radiation including the electromagnetic radiation emitted from antenna 45, antenna 32 outputs a corresponding electrical signal.

The carrier regenerator 33 extracts a signal of a component corresponding to the carrier from the electrical signal output by antenna 32, and regenerates the carrier on the basis of the extracted signal. For example, the VCO or the PLL is used to regenerate the electromagnetic radiation. The carrier regenerator 33 adjusts the level of the regenerated carrier to an appropriate level, and then supplies the carrier to the modulation processor 37.

In response to the magnetic resonance signal emitted from the subject 200 as electromagnetic radiation, RF coil 34 outputs a corresponding magnetic resonance signal.

The logarithmic amplifier 35 compresses, in accordance with a predetermined logarithmic function, the amplitude of the magnetic resonance signal output by RF coil 34.

Analog-to-digital converter 36 digitizes the analog magnetic resonance signal output from the logarithmic amplifier 35. Analog-to-digital converter 36 performs the sampling of the magnetic resonance signal for digitization synchronously with the sampling clock signal supplied from the sampling clock regenerator 31.

The modulation processor 37 adds, for example, an error detecting code, coil information and point information to the magnetic resonance signal digitized in analog-to-digital converter 36. In addition, the modulation processor 37 uses the analog-to-digital conversion start signal added to the sampling clock signal as a trigger to add the code and information. For example, a cyclic redundancy check (CRC) calculation code can be used as the error detecting code. The coil information can suitably include, for example, identification information, type information or characteristic information regarding RF coil unit 6b. The point information indicates the number of a point counted from the trigger made by the analog-to-digital conversion start signal. Then, the modulation processor 37 performs encoding for digital transmission for the magnetic resonance signal to which the code and information have been added. For example, an 8/10B encoding scheme can be applied to this encoding. Further, the modulation processor 37 uses the encoded magnetic resonance signal to modulate the carrier supplied from the carrier regenerator 33, and thereby obtains a transmission signal.

Driver 38 adjusts the level of the transmission signal output from the modulation processor 37 to a level suitable for wireless transmission, and then supplies the signal to antenna 39.

Antenna 39 emits the electrical transmission signal supplied from driver 38 into space as electromagnetic radiation.

Driver 46 adjusts the level of the carrier output from driver 43 to an appropriate level, and then supplies the carrier to the demodulation processor 49.

Driver 47 adjusts the level of the sampling clock signal output by the sampling clock generator 8 to an appropriate level, and then supplies the signal to the digital-to-analog converter 50.

In response to electromagnetic radiation including the electromagnetic radiation emitted from antenna 39, antenna 48 outputs a corresponding electrical signal.

The demodulation processor 49 uses the carrier supplied from driver 46 to demodulate the electrical signal output from antenna 48 into a digital magnetic resonance signal.

The digital-to-analog converter 50 converts the digital magnetic resonance signal output from the demodulation processor 49 into an analog form synchronously with the sampling clock signal supplied from driver 47. Then, the analog magnetic resonance signal obtained by the digital-to-analog converter 50 is provided to the system receiver 12 as an output of radio unit 11.

The system receiver 12 converts the frequency of the magnetic resonance signal output from radio unit 11 into an intermediate frequency. The system receiver 12 further adjusts the amplitude of the frequency-converted magnetic resonance signal so that this magnetic resonance signal may be suitably input to analog-to-digital converter 13.

Analog-to-digital converter 13 digitizes the analog magnetic resonance signal output from the system receiver 12. Analog-to-digital converter 13 is provided with the sampling clock signal after the level of this signal has been properly adjusted by driver 10. Analog-to-digital converter 13 performs the sampling of the magnetic resonance signal for digitization synchronously with the sampling clock signal.

The system reconstruction front end 15 subjects the magnetic resonance signal digitized by analog-to-digital converter 13 to gain control, frequency conversion and quadrature detection. The system reconstruction front end 15 further uncompresses the amplitude of the magnetic resonance signal compressed in RF coil unit 6b.

The system receiver 16 converts the frequency of the magnetic resonance signal output from RF coil unit 6c into an intermediate frequency. Further, the system receiver 12 adjusts the amplitude of the frequency-converted magnetic resonance signal so that this magnetic resonance signal may be suitably input to analog-to-digital converter 13.

Analog-to-digital converter 17 digitizes the analog magnetic resonance signal output from the system receiver 16. Analog-to-digital converter 17 is provided with the sampling clock signal after the level of this signal has been properly adjusted by driver 18. Analog-to-digital converter 17 performs the sampling of the magnetic resonance signal for digitization synchronously with the sampling clock signal.

The system reconstruction front end 19 subjects the magnetic resonance signal digitized by analog-to-digital converter 17 to gain control, frequency conversion and quadrature detection.

The reconstruction system 20 reconstructs an image of the subject 200 on the basis of at least one of the magnetic resonance signals processed in the system reconstruction front ends 15, 19.

The storage unit 21 stores various kinds of data such as image data indicating the image reconstructed in the reconstruction system 20.

The display unit 22 displays the image reconstructed in the reconstruction system 20 or various kinds of information including various kinds of operation screens for a user to operate the magnetic resonance diagnostic apparatus 100, under the control of the main control unit 24. A display device such as a liquid crystal display can be used as the display unit 22.

The input unit 23 accepts various commands and information inputs from the operator. A pointing device such as a mouse or a track ball, a selecting device such as a mode switch, or an input device such as a keyboard can be suitably used as the input unit 23.

The main control unit 24 has a CPU, a memory, etc., that are not shown, and controls the whole magnetic resonance diagnostic apparatus 100.

Now, the operation of the magnetic resonance diagnostic apparatus 100 having such a configuration is described.

When RF coil unit 6c is used to imaging the subject 200, a magnetic resonance signal obtained by RF coil unit 6c is transmitted in an analog state, and input to the system receiver 16. Then, the magnetic resonance signal is subjected to known processing by the system receiver 16, analog-to-digital converter 17 and the system reconstruction front end 19. The magnetic resonance signal which has been subjected to such processing is used by the reconstruction system 20 to reconstruct an image of the subject 200.

On the other hand, when RF coil unit 6b is used to imaging the subject 200, a magnetic resonance signal obtained by RF coil unit 6c is digitized after the amplitude of this magnetic resonance signal is compressed by the logarithmic amplifier 35, and digitally and wirelessly transmitted to radio unit 11.

In this case, for the digitization of the magnetic resonance signal, a sampling clock signal which has been generated by the sampling clock generator 8 provided on the main unit side of the magnetic resonance diagnostic apparatus 100 and wirelessly transmitted to RF coil unit 6b by radio unit 11 is used. In order to obtain a transmission signal, a carrier generated by the modulation/demodulation oscillator 42 provided in radio unit 11 and wirelessly transmitted to RF coil unit 6b by radio unit 11 is used.

Furthermore, the magnetic resonance signal digitized for digital wireless transmission is converted into an analog form in radio unit 11, and then input to the system receiver 12. The magnetic resonance signal is subjected to substantially known processing by the system receiver 12, analog-to-digital converter 13 and the system reconstruction front end 15. However, in the system reconstruction front end 15, the amplitude of the digital magnetic resonance signal compressed in the logarithmic amplifier 35 is uncompressed. The magnetic resonance signal which has been subjected to such processing is used by the reconstruction system 20 to reconstruct an image of the subject 200.

In addition, a restore parameter conforming to the characteristics of the amplitude compression in the logarithmic amplifier 35 is needed to uncompress the compressed amplitude. For this restore parameter, a representing value conforming to the representing characteristics of the plurality of RF coil units 6b may be used. In this case, a memory storing the representing value of the restore parameter has only to be provided in the system reconstruction front end 15. However, in order to compensate for variations in the characteristics of each of the plurality of RF coil units 6b, it is desirable to perform calibration to obtain the restore parameter. In this case, the system reconstruction front end 15 is provided with a function to calculate a restore parameter for restoring a known signal (e.g., a sinusoidal signal) from the signal output from analog-to-digital converter 13, and is also provided with a memory for storing the restore parameter thus calculated. Then, a restore parameter is calculated for the signal provided from analog-to-digital converter 13 to the system reconstruction front end 15 when the known signal is input to the logarithmic amplifier 35, and this restore parameter is stored. At the time of subsequent imaging, the stored restore parameter is used to restore the magnetic resonance signal. In addition, the calibration may be carried out when the magnetic resonance diagnostic apparatus 100 is installed or when RF coil unit 6b is exchanged. If the plurality of RF coil units 6b are properly exchanged and used, a restore parameter for each of the plurality of RF coil units 6b may be calculated in advance and stored in the system reconstruction front end 15. At the time of imaging, a restore parameter corresponding to RF coil unit. 6b used on the basis of the coil information may be selected and used.

Thus, in the magnetic resonance diagnostic apparatus 100, RF coil unit 6b wirelessly transmits the magnetic resonance signal, so that there is no need for cables to connect RF coil unit 6b to the main unit side of the magnetic resonance diagnostic apparatus 100. Moreover, as the magnetic resonance signal is digitally and wirelessly transmitted from RF coil unit 6b to the main unit side of the magnetic resonance diagnostic apparatus 100, radio output is constrained to suppress the effect of the magnetic resonance signal on reception performance, and at the same time, the magnetic resonance signal can be wirelessly transmitted in a satisfactory manner without being affected by a signal loss attributed to space propagation.

Furthermore, in the magnetic resonance diagnostic apparatus 100, the sampling clock signal and the carrier is wirelessly transmitted from the main unit side of the magnetic resonance diagnostic apparatus 100 to RF coil unit 6b, and the sampling clock signal and the carrier are common to the main unit side of the magnetic resonance diagnostic apparatus 100 and RF coil unit 6b, such that a high level of synchronism can be kept between the main unit side of the magnetic resonance diagnostic apparatus 100 and RF coil unit 6b.

In the magnetic resonance diagnostic apparatus 100, the logarithmic amplifier 35 compresses the amplitude of the magnetic resonance signal, so that the dynamic range can be greater than when the magnetic resonance signal is directly digitized. Moreover, the compressed amplitude is uncompressed on the main unit side of the magnetic resonance diagnostic apparatus 100. However, if this uncompression is digitally performed by the system reconstruction front end 15, the system reconstruction front end 15 can basically follow the conventional configuration with a slight software modification.

Moreover, in the magnetic resonance diagnostic apparatus 100, the magnetic resonance signal is put back into an analog state in radio unit 11, so that it is possible to use the system receiver 12, analog-to-digital converter 13 and the system reconstruction front end 15 substantially similar in configuration to the system receiver 16, analog-to-digital converter 17 and the system reconstruction front end 19 which have heretofore been used to process the analog magnetic resonance signal. Consequently, the magnetic resonance diagnostic apparatus 100 can be obtained by a simple modification without any drastic design change in the conventional magnetic resonance diagnostic apparatus.

Second Embodiment

Figure 3:
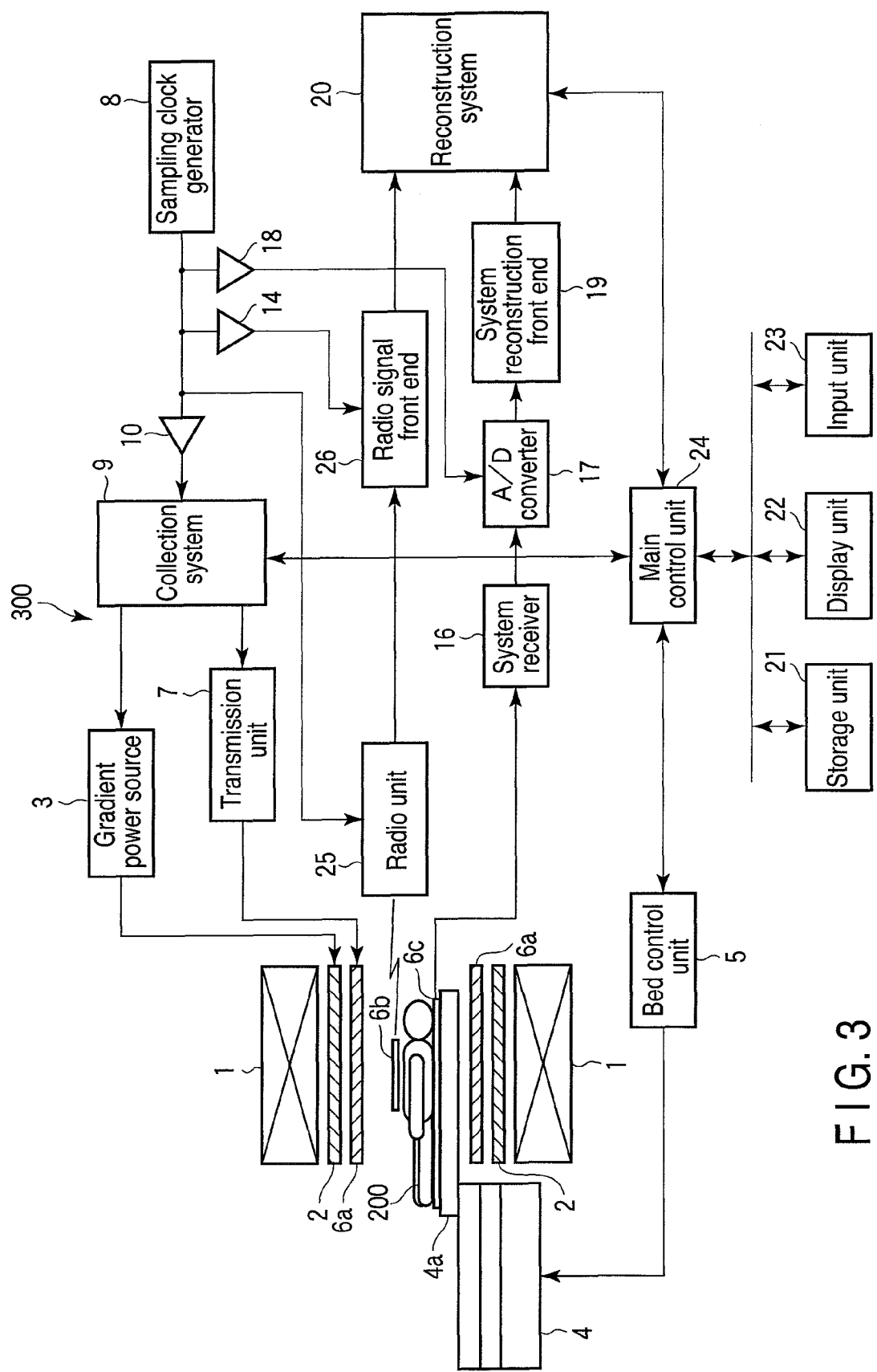
FIG. 3 is a diagram showing the configuration of a magnetic resonance diagnostic apparatus according to a second embodiment of the present invention.

FIG. 3 is a diagram showing the configuration of a magnetic resonance diagnostic apparatus 300 according to a second embodiment. It should be noted that the same parts as the parts shown in FIG. 1 are provided with the same reference numerals in FIG. 3 and are not described in detail.

The magnetic resonance diagnostic apparatus 300 comprises a static field magnet 1, a gradient magnetic field coil 2, a gradient power source 3, a bed 4, a bed control unit 5, RF coil units 6a, 6b, 6c, a transmission unit 7, a sampling clock generator 8, a collection system 9, a driver 10, a driver 14, a system receiver 16, an analog-to-digital converter (A/D converter) 17, a driver 18, a system reconstruction front end 19, a reconstruction system 20, a storage unit 21, a display unit 22, an input unit 23, a main control unit 24, a radio unit 25 and a radio signal front end 26.

That is to say, the magnetic resonance diagnostic apparatus 300 comprises radio unit 25 and the radio signal front end 26 instead of radio unit 11, the system receiver 12, analog-to-digital converter 13 and the system reconstruction front end 15 in the magnetic resonance diagnostic apparatus 100.

FIG. 4 is a block diagram showing the specific configuration of radio unit 25 in FIG. 3. It should be noted that the same parts as the parts shown in FIG. 2 are provided with the same reference numerals in FIG. 4 and are not described in detail.

Radio unit 25 includes a driver 40, an antenna 41, a modulation/demodulation oscillator 42, drivers 43, 44, an antenna 45, a driver 46, an antenna 48 and a demodulation processor 49.

That is to say, radio unit 25 has a configuration without driver 47 and the digital-to-analog converter 50 in radio unit 11. Radio unit 25 outputs a digital magnetic resonance signal obtained in the demodulation processor 49 to the radio signal front end 26.

The radio signal front end 26 converts the frequency of the magnetic resonance signal output from radio unit 11 into an intermediate frequency. The radio signal front end 26 subjects the frequency-converted magnetic resonance signal to gain control, frequency conversion to a lower frequency, and quadrature detection. The radio signal front end 26 further uncompresses the amplitude of the magnetic resonance signal compressed in RF coil unit 6b. In addition, the radio signal front end 26 digitally performs the various kinds of processing.

Thus, according to the magnetic resonance diagnostic apparatus 300 described above, more design modifications to the conventional magnetic resonance diagnostic apparatus are made than in the case of the magnetic resonance diagnostic apparatus 100. However, in the magnetic resonance diagnostic apparatus 100, a transmission time is delayed, so that it is necessary to consider the stabilization of the delay time, for example, by adjusting the output timing of a trigger to allow for the delay time or by buffering the magnetic resonance signal in radio unit 11. In contrast, according to the magnetic resonance diagnostic apparatus 300, the transmission time is not delayed, and there is no need for the processing that is required in the magnetic resonance diagnostic apparatus 100.

Various modifications can be made in this embodiment as follows:

(1) Instead of RF coil unit 6b, it is possible to use a multicoil type RF coil unit such as an RF coil unit 6d shown in FIG. 5. In this case, radio unit 11 is replaced with a radio unit adapted to the multicoil type RF coil unit such as a radio unit 27 shown in FIG. 5. Moreover, the system receivers 12, analog-to-digital converters 13 and the system reconstruction front ends 15 are provided equally in number to the coils included in RF coil unit.

FIG. 5 is a block diagram showing the configurations of RF coil unit 6d and radio unit 27. It should be noted that the same parts as the parts in FIG. 1 are provided with the same reference numerals in FIG. 5 and are not described in detail.

RF coil unit 6d includes an antenna 30, a sampling clock regenerator 31, an antenna 32, a carrier regenerator 33, RF coils 34a, 34b, logarithmic amplifiers 35a, 35b, analog-to-digital converters 36a, 36b, a modulation processor 37, a driver 38, an antenna 39, and a multiplex circuit 51. Radio unit 27 includes a driver 40, an antenna 41, a modulation/demodulation oscillator 42, drivers 43, 44, an antenna 45, drivers 46, 47a, 47b, an antenna 48, a demodulation processor 49, digital-to-analog converters 50a, 50b and a separation circuit 52.

RF coils 34a, 34b, the logarithmic amplifiers 35a, 35b, analog-to-digital converters 36a, 36b, drivers 47a, 47b and the digital-to-analog converters 50a, 50b are similar in function to RF coil 34, the logarithmic amplifier 35, analog-to-digital converter 36, driver 47 and the digital-to-analog converter 50, respectively.

The multiplex circuit 51 subjects digital magnetic resonance signals output from analog-to-digital converters 36a, 36b to time-division multiplexing. Then, the multiplex circuit 51 outputs the multiplexed magnetic resonance signals to the modulation processor 37.

The separation circuit 52 separates the two magnetic resonance signals multiplexed by a magnetic resonance signal output from the demodulation processor 49. The separation circuit 52 outputs the separated two magnetic resonance signals to the digital-to-analog converters 50a, 50b, respectively.

Such a configuration enables the magnetic resonance signals of multiple channels to be wirelessly transmitted through one radio channel.

In addition, an RF coil unit having three or more RF coils can also be used.

Moreover, such a modified configuration can be applied to the configuration in the second embodiment.

(2) In order to improve a radio error rate, for example, an oven controlled crystal oscillator (OCXO) may be incorporated in the RF coil unit to generate a highly accurate clock in the RF coil unit. In this case, for the demodulation in the demodulation processor, the technique of clock data recovery may be used to extract a carrier clock from a received signal, or RF coil unit may transmit a highly accurate clock over a radio signal so that the demodulation processor achieves demodulation using this highly accurate clock. An improvement in the error rate is expected in this case.

(3) A plurality of processing systems including radio units 11, the system receivers 12, analog-to-digital converters 13 and the system reconstruction front ends 15 and a plurality of processing systems including radio units 25 and the radio signal front ends 26 may be provided in parallel.

(4) A plurality of processing systems including the system receivers 16, analog-to-digital converters 17 and the system reconstruction front ends 19 may be provided in parallel, or no such processing system may be provided.

(5) There is no guarantee that the rate of wireless transmission is always higher than the rate of the magnetic resonance signal input to the modulation processor 37. Thus, a buffer memory 60 may be provided before the modulation processor 37 as shown in FIG. 6 to adjust the rate of the magnetic resonance signal input to the modulation processor 37 to the rate of wireless transmission.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance diagnostic apparatus which includes a main unit and a coil unit separate from the main unit, the magnetic resonance diagnostic apparatus comprising:
   a sampling clock generating unit which is provided in the main unit and which generates a sampling clock signal;
   a sampling clock transmitting unit which is provided in the main unit and which wirelessly transmits the sampling clock signal generated by the sampling clock generating unit;
   a sampling clock receiving unit which is provided in the coil unit and which receives the sampling clock signal transmitted by the sampling clock transmitting unit;
   a receiving coil which is provided in the coil unit and which outputs an electrical magnetic resonance signal in response to a magnetic resonance signal emitted from a subject as electromagnetic radiation;
   a compression unit which is provided in the coil unit and which compresses the amplitude of the magnetic resonance signal output by the receiving coil;
   a digitization unit which is provided in the coil unit and which digitizes, synchronously with the sampling clock signal received by the sampling clock receiving unit, the magnetic resonance signal compressed by the compression unit;
   a resonance signal transmitting unit which is provided in the coil unit and which wirelessly transmits the magnetic resonance signal digitized by the digitization unit;
   a resonance signal receiving unit which is provided in the main unit and which receives the magnetic resonance signal transmitted by the resonance signal transmitting unit; and
   a reconstruction unit which is provided in the main unit and which processes, synchronously with the sampling clock signal generated by the sampling clock generating unit, the magnetic resonance signal received by the resonance signal receiving unit and thereby reconstructs an image of the subject.

2. The magnetic resonance diagnostic apparatus according to claim 1, further comprising:
   a modulation/demodulation clock generating unit which is provided in the main unit and which generates a modulation/demodulation clock signal;
   a modulation/demodulation clock transmitting unit which is provided in the main unit and which wirelessly transmits the modulation/demodulation clock signal generated by the modulation/demodulation clock generating unit; and
   a modulation/demodulation clock receiving unit which is provided in the coil unit and which receives the modulation/demodulation clock signal transmitted by the modulation/demodulation clock transmitting unit,
   wherein the resonance signal transmitting unit modulates, synchronously with the modulation/demodulation clock signal received by the modulation/demodulation clock receiving unit, the magnetic resonance signal digitized by the digitization unit, and
   the resonance signal receiving unit demodulates, synchronously with the modulation/demodulation clock signal generated by the modulation/demodulation clock generating unit, the magnetic resonance signal transmitted by the resonance signal transmitting unit and thereby acquires the digitized magnetic resonance signal.

3. The magnetic resonance diagnostic apparatus according to claim 1,
   wherein the reconstruction unit subjects the magnetic resonance signal received by the resonance signal receiving unit to digital processing to uncompress the amplitude of the magnetic resonance signal compressed by the compression unit, and then reconstructs an image of the subject on the basis of the magnetic resonance signal which has been subjected to the digital processing.

4. The magnetic resonance diagnostic apparatus according to claim 1, wherein the reconstruction unit measures a restore parameter for restoration of a known test signal from a signal received by the resonance signal receiving unit when the test signal is input to the compression unit, and the reconstruction unit uses this restore parameter to perform the digital processing.

5. A magnetic resonance diagnostic main unit which configures a magnetic resonance diagnostic apparatus together with a coil unit, the coil unit including:
   a sampling clock receiving unit which receives a wirelessly transmitted sampling clock signal;
   a receiving coil which outputs an electrical magnetic resonance signal in response to a magnetic resonance signal emitted from a subject as electromagnetic radiation;
   a compression unit which is provided in the coil and which compresses the amplitude of the magnetic resonance signal output by the receiving coil;
   a digitization unit which digitizes, synchronously with the sampling clock signal received by the sampling clock receiving unit, the magnetic resonance signal compressed by the compression unit; and
   a resonance signal transmitting unit which wirelessly transmits the magnetic resonance signal digitized by the digitization unit,
   the magnetic resonance diagnostic main unit comprising:
   a sampling clock generating unit which generates the sampling clock signal;
   a sampling clock transmitting unit which wirelessly transmits the sampling clock signal generated by the sampling clock generating unit;

a resonance signal receiving unit which receives the magnetic resonance signal transmitted by the resonance signal transmitting unit; and a reconstruction unit which processes, synchronously with the sampling clock signal generated by the sampling clock generating unit, the magnetic resonance signal received by the resonance signal receiving unit and thereby reconstructs an image of the subject.

6. A coil unit which configures a magnetic resonance diagnostic apparatus together with a main unit, the main unit including:

a sampling clock generating unit which generates a sampling clock signal;

a sampling clock transmitting unit which wirelessly transmits the sampling clock signal generated by the sampling clock generating unit;

a resonance signal receiving unit which receives a wirelessly transmitted magnetic resonance signal; and a reconstruction unit which processes, synchronously with the sampling clock signal generated by the sampling clock generating unit, the magnetic resonance signal received by the resonance signal receiving unit and thereby reconstructs an image of a subject, the coil unit comprising:

a sampling clock receiving unit which receives the sampling clock signal transmitted by the sampling clock transmitting unit;

a receiving coil which outputs an electrical magnetic resonance signal in response to a magnetic resonance signal emitted from the subject as electromagnetic radiation;

a compression unit which is provided in the coil unit and which compresses the amplitude of the magnetic resonance signal output by the receiving coil;

a digitization unit which digitizes, synchronously with the sampling clock signal received by the sampling clock receiving unit, the magnetic resonance signal compressed by the compression unit; and a resonance signal transmitting unit which wirelessly transmits the magnetic resonance signal digitized by the digitization unit.

* * * * *